(12) United States Patent
Lappen

(10) Patent No.: US 6,625,898 B2
(45) Date of Patent: Sep. 30, 2003

(54) VARIABLE METHOD AND APPARATUS FOR ALIGNMENT OF AUTOMATED WORKPIECE HANDLING SYSTEMS

(75) Inventor: Alan Rick Lappen, San Martin, CA (US)

(73) Assignee: Applied Materials, Inc, Santa Clara, CA (US)

( * ) Notice: Subject to any disclaimer, the term of this patent is extended or adjusted under 35 U.S.C. 154(b) by 0 days.

(21) Appl. No.: 09/881,855

(22) Filed: Jun. 13, 2001

(65) Prior Publication Data

US 2002/0189122 A1 Dec. 19, 2002

(51) Int. Cl.[7] .............................................. G01D 21/00
(52) U.S. Cl. .......................................... 33/645; 33/613
(58) Field of Search ........................ 33/533, 613, 645; 414/935, 938; 700/213

(56) References Cited

U.S. PATENT DOCUMENTS

| | | | |
|---|---|---|---|
| 3,877,134 A | | 4/1975 | Shanahan |
| 3,934,733 A | | 1/1976 | Worden |
| 4,176,751 A | | 12/1979 | Gillissie |
| 4,493,418 A | | 1/1985 | Johnson |
| 4,687,097 A | | 8/1987 | Mortensen |
| 5,042,671 A | | 8/1991 | Bischoff et al. |
| 5,111,936 A | | 5/1992 | Kos |
| D368,802 S | | 4/1996 | Gallagher et al. |
| 5,519,315 A | * | 5/1996 | Park et al. ................. 33/533 |
| 5,713,711 A | | 2/1998 | McKenna et al. |
| 5,779,203 A | | 7/1998 | Edlinger |
| 5,784,802 A | * | 7/1998 | Thompson et al. ......... 414/938 |
| 5,785,186 A | | 7/1998 | Babbs et al. |
| 5,822,942 A | * | 10/1998 | Lucia, Jr. .................... 33/533 |
| 5,951,770 A | * | 9/1999 | Perlov et al. .............. 414/935 |
| 6,010,009 A | | 1/2000 | Peterson et al. |
| 6,036,031 A | | 3/2000 | Ishikawa |
| 6,039,186 A | | 3/2000 | Bhatt et al. |
| 6,095,335 A | | 8/2000 | Busby |
| 6,013,894 A1 | * | 1/2001 | Cheng et al. ............... 414/938 |
| 6,209,218 B1 | * | 4/2001 | Della Polla ................. 33/645 |
| 6,260,284 B1 | * | 7/2001 | Su ................................ 33/645 |
| 2002/0015633 A1 | * | 2/2002 | Fosnight et al. ......... 414/222.01 |
| 2002/0021959 A1 | * | 2/2002 | Schauer et al. ............ 414/938 |

FOREIGN PATENT DOCUMENTS

| | | | |
|---|---|---|---|
| CH | 683420 | 3/1994 | |
| EP | 1047115 | 10/2000 | |
| GB | 1047115 A2 | * 10/2000 | ................. 414/938 |
| JP | 9139415 | 5/1997 | |
| JP | 10-144755 | 5/1998 | |
| JP | 10-223643 | 8/1998 | |

* cited by examiner

*Primary Examiner*—Diego Gutierrez
*Assistant Examiner*—Travis Reis
(74) *Attorney, Agent, or Firm*—Konrad Raynes Victor & Mann, LLP

(57) ABSTRACT

An alignment tool, method and system are provided for aligning a robot blade and a cassette in a workpiece handling system, in which the tool comprises a frame or fixture adapted to emulate a plurality of different types of cassettes. The frame is adapted to be supported by a cassette handler system and includes a plurality of alignment and registration surfaces adapted to emulate corresponding alignment and registration surfaces of a cassette. A removable H bar may be attached to the frame in a plurality of selectable positions to emulate one or more of a plurality of different cassette H bar positions of different types of cassettes. A kit of selectable and removable rear guide rails permit one pair of rear guide rails to be substituted for another pair of rear guide rails to permit the frame to emulate the particular rear guide rail arrangement of a plurality of different cassettes.

26 Claims, 14 Drawing Sheets

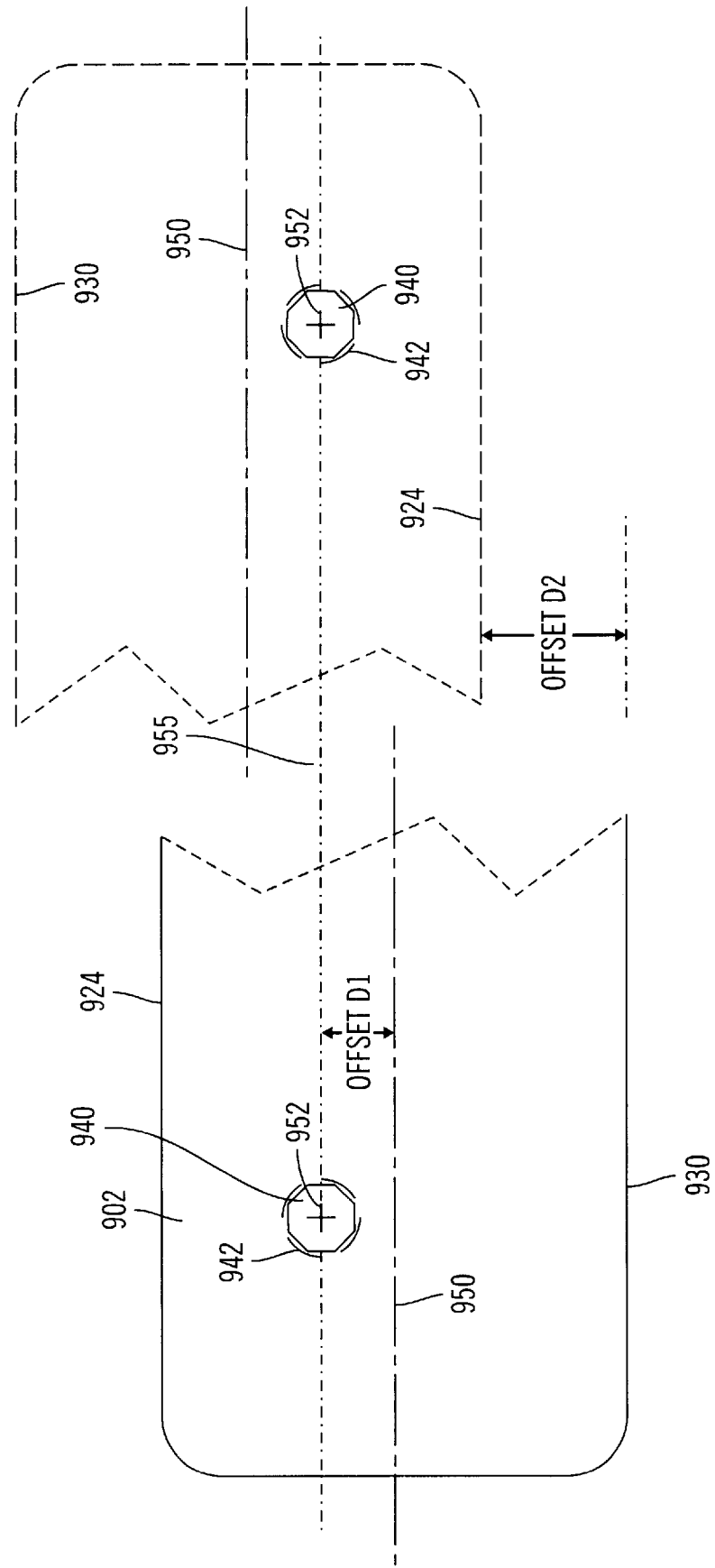

VARIABLE METHOD AND APPARATUS FOR ALIGNMENT OF AUTOMATED WORKPIECE HANDLING SYSTEMS

FIELD OF THE INVENTION

The present invention relates to automated workpiece handling systems, and more particularly, to methods and devices for aligning a cassette for workpieces in an automated workpiece handling system.

BACKGROUND OF THE INVENTION

In order to decrease contamination and to enhance throughput, semiconductor processing systems often utilize one or more robots to transfer semiconductor wafers, substrates and other workpieces between a number of different vacuum chambers which perform a variety of tasks. An article entitled "Dry Etching Systems: Gearing Up for Larger Wafers", in the October, 1985 issue of Semiconductor International magazine, pages 48–60, describes a four-chamber dry etching system in which a robot housed in a pentagonal-shaped mainframe serves four plasma etching chambers and a loadlock chamber mounted on the robot housing. In order to increase throughput, it has been proposed to utilize two loadlock chambers as described in U.S. Pat. No. 5,186,718. In such a two-loadlock chamber system, both loadlock chambers are loaded with full cassettes of unprocessed wafers. FIG. 1 of the present application illustrates two typical loadlock chambers LLA and LLB, each having a cassette 190 therein for holding unprocessed wafers 192 to be unloaded by a robot 194 in a transfer chamber 195 and transferred to various processing chambers 196 attached to a mainframe 198.

The loadlock chamber LLA, for example, is a pressure-tight enclosure which is coupled to the periphery of the mainframe 198 by interlocking seals which permit the loadlock chamber to be removed and reattached to the mainframe as needed. The cassette 190 is loaded into the loadlock chamber LLA through a rear door, which is closed in a pressure-tight seal. The wafers are transferred between the mainframe 198 and the loadlock chamber LLA through a passageway 199 which may be closed by a slit valve to isolate the loadlock chamber volume from the mainframe volume.

As shown in FIG. 2, a typical cassette 190 is supported by a platform 200 of a cassette handler system 208, which includes an elevator 210, which elevates the platform 200 and the cassette 190. The platform 200 has a top surface, which defines a base plane 220 on which the cassette 190 rests. As the cassette includes a plurality of "slots" 204 or wafer support locations, the elevator moves the cassette to sequentially position each of the slots with the slit valves to allow a robot blade to pass from the mainframe, through the slit valve, and to a location to "pick" or deposit a wafer in a wafer slot.

The slots 204 of the cassette may be initially loaded with unprocessed wafers or other workpieces before the cassette is loaded into the loadlock chamber LLA. The number of unprocessed wafers initially loaded into the cassette may depend upon the design of the cassette. For example, some cassettes may have slots for 25 or more wafers.

After the loadlock access door is closed and sealed, the loadlock chamber is then pumped by a pump system down to the vacuum level of the mainframe 198 before the slit valve is opened. The robot 194 which is mounted in the mainframe 198 then unloads the wafers from the cassette one at a time, transferring each wafer in turn to the first processing chamber. The robot 194 includes a robot hand or blade 206, which is moved underneath the wafer to be unloaded. The robot 194 then "lifts" the wafer from the wafer slot supports supporting the wafers in the cassette 190. By "lifting," it is meant that either the robot blade 206 is elevated or the cassette 190 is lowered by the handler mechanism 208 such that the wafer is lifted off the cassette wafer supports. The wafer may then be withdrawn from the cassette 190 through the passageway and transferred to the first processing chamber.

Once a wafer has completed its processing in the first processing chamber, that wafer is transferred to the next processing chamber (or back to a cassette) and the robot 194 unloads another wafer from the cassette 190 and transfers it to the first processing chamber. When a wafer has completed all the processing steps of the wafer processing system, the robot 194 returns the processed wafer back to the cassette 190 from which it came. Once all the wafers have been processed and returned to the cassette 190, the cassette in the loadlock chamber is removed and another full cassette of unprocessed wafers is reloaded. Alternatively, a loaded cassette may be placed in one loadlock, and an empty one in the other loadlock. Wafers are thus moved from the full cassette, processed, and then loaded into the (initially) empty cassette in the other loadlock. Once the initially empty cassette is full, the initially full cassette will be empty. The full "processed" cassette is exchanged for a full cassette of unprocessed wafers, and these are then picked from the cassette, processed, and returned to the other cassette. The movements of the robot 194 and the cassette handler 208 are controlled by an operator system controller 222 (FIG. 1), which is often implemented with a programmed workstation.

As shown in FIGS. 2 and 3, the wafers are typically very closely spaced in many wafer cassettes. For example, the spacing between adjacent wafers 230 and 232 in the cassette may be as small as 0.050 inches. Thus, the wafer blade 206 is often very thin, to fit between wafers as cassettes are loaded or unloaded. As a consequence, it is often preferred in many processing systems for the cassette and the cassette handler 208 to be precisely aligned with respect to the robot blade and wafer to avoid accidental contact between either the robot blade or the wafer carried by the blade and the walls of the cassette or with other wafers held within the cassette.

A metrology tool system which facilitates alignment of a cassette and a cassette handler is indicated generally at 400 in FIG. 4 and is described in copending application Ser. No. 09/294,301, filed Apr. 19, 1999 and entitled "METHOD AND APPARATUS FOR ALIGNING A CASSETTE" and assigned to the assignee of the present application. As described therein, the cassette alignment tool system 400 comprises a metrology tool or "cassette" 410 which emulates an actual cassette to be aligned. A cassette controller 412 is coupled by communication cables 414 to the metrology cassette 410, and a computer 416 is coupled by a communication cable 418 to the cassette controller 412. The metrology cassette 410 is secured to the cassette handler platform 200 in the same manner as an actual wafer cassette such as the cassette 190 of FIG. 2 and thus emulates the wafer cassette 190.

For example, the metrology cassette 410 preferably approximates the size and weight of a production wafer cassette full of wafers. In addition, the metrology cassette has alignment and registration surfaces similar to those of an actual cassette. The top surface of the top plate 612 and the bottom surface of the base plate 630 are both machined to imitate the bottom alignment and registration features of common wafer cassettes. This allows it to be inserted into most systems with measurement sensors directed upward or downward as needed.

Thus, the metrology cassette 410 has on the bottom of its frame a leading edge surface 422 and a trailing edge surface 424 of an H-bar 430 (FIGS. 5a–5c), and interior edge surfaces 562 of a pair of support runner or side rails 570 (FIG. 5b) which are received by corresponding alignment and registration surfaces of the cassette handler to align the cassette with respect to the handler. Similarly, the metrology cassette 410 has on the top of its frame an H-bar 430 (FIGS. 5c–5d), and side rails 570 (FIG. 5d) which are likewise received by corresponding alignment and registration surfaces of the cassette handler to align the cassette with respect to the handler in the inverted position. Still further, the metrology cassette 410 has rear edge surfaces 572 and side face surfaces 573 of a pair of rear guide rails 574 (FIGS. 5a and 5e) which are received by the handler. Variations and compromises from the features of individual cassettes can be made so as to accommodate the widest possible range of systems and cassettes. For example, by choosing the smallest size of the registration surfaces within the permitted range of tolerances of the cassettes to be emulated, the number of cassettes which can be emulated by a single tool 410 may be increased.

FIG. 6 shows an exploded view of an example of a typical cassette handler system which is indicated generally at 208. The handler system 208 is generally intended for use with cassettes which meet the SEMI (Semiconductor Equipment and Materials International, formerly known as Semiconductor Equipment and Materials Institute) standard for 150 mm cassettes. The SEMI standard is an internationally recognized standard which specifies many of the alignment and registration surfaces for 150 mm and other cassettes. The handler systems for non-SEMI standard cassettes are generally similar.

The handler system 208 includes an auto loader tilt out assembly 702 which facilitates automatic loading of cassettes into the handler system 208. The tilt out assembly 702 includes a receptacle 704 which is often referred to as the rear guide rail "bucket." To install a cassette into the handler system 208, the bucket 704 is typically first tilted or rotated to a generally horizontal position using an auto loader tilt out mechanism 706 which is supported by an auto loader rotation support base 708. The alignment and registration surfaces of the rear guide rails of the cassette, such as the rear guide rails 574 of the metrology cassette 410, are received into a correspondingly shaped alignment and registration surfaces of a pocket 710 of the bucket 702 which provides an initial alignment of the cassette with respect to the handler system. The bottom of the cassette is placed against a bottom plate 712 of a platform 200 which includes a receptacle 714 often referred to as an "H" bar alignment nest.

When the auto loader tilt out assembly 702 is tilted forward, the cassette is rotated to an upright position in which the cassette is supported by the bottom plate 712 of the platform 200. The H bar alignment nest 714 has a slot 716 which has alignment and registration surfaces to receive the leading and trailing alignment and registration surfaces of an H bar of a cassette, such as the leading and trailing alignment and registration surfaces 422 and 424, respectively, of the H bar 430 of the metrology cassette 410 of FIG. 5a, to provide a more precise front to rear alignment of the cassette. In addition, the nest 714 is received between the cassette side rails 570 with the alignment and registration edges 718 of the nest engaging the alignment and registration interior edge surfaces 562 of the cassette side rails 570 to provide a more precise left to right alignment of the cassette.

As described in greater detail in the aforementioned copending application Ser. No. 09/294,301, filed Apr. 19, 1999, the metrology cassette 410 has one or more distance measurement devices 800 (FIG. 4) which can provide precise measurements of the position of a wafer or other workpiece being held by the robot blade within the metrology cassette 410. These wafer position measurements can be used to accurately align an actual wafer cassette such as the cassette 190 to the robot blade in such a manner as to reduce or eliminate accidental contact between the blade or the wafer held by the blade and the cassette or wafers held within the wafer cassette when the actual cassette is loaded into the cassette handler after completion of the alignment procedure and the metrology cassette is removed.

As best seen in FIGS. 5a and 7, the distance measurement device 800 of these figures includes three laser sensors A, B and C, each of which includes a laser head 810b, 810r or 810y, which is clamped in a mounting 812b, 812r or 812y, respectively, carried by the metrology cassette 410. These sensors operate based upon perpendicular beam, scattered reflection triangulation using a position sensing diode array. The light source (laser) impinges upon the target perpendicular to the surface of the target, preferably within a relatively small angle. The surface preferably provides a diffuse reflection that is visible to the sensing device over a relatively wide angle. The field of view of the sensing device is focused upon a linear optical sensor, the output of which is interpreted to determine the displacement of the target surface within the field of view. The geometry of the light path therefore forms a right triangle 522 with light from the light source traveling along the vertical edge and reflected light of the return path traveling along the diagonal. The distance between the sensor and the target may then be calculated using the Pythagorean theorem.

By precisely measuring the position of the wafer held by the robot blade, the orientation of the cassette handler platform may be adjusted to provide the desired alignment between the robot blade and the cassette held by the cassette handler system. To provide the desired adjustments, the handler system of FIG. 6 has a plurality of adjustment screws 830 which can be individually rotated to tilt an elevator attachment plate 832 and an elevator base plate assembly 834 which support the cassette handler platform 712 on which the cassette rests as described above.

Once a particular handling system has been properly aligned and calibrated to the robot blade and workpiece, the alignment of the handler may be clamped in place by tightening clamp screws 830 of the auto loader tilt out mechanism 706. The metrology cassette 410 may then be removed from the handler and processing of workpieces may begin using a standard workpiece cassette which was emulated by the metrology cassette 410. However, it is preferred that all handlers of a particular processing system be properly aligned prior to initiating processing of production workpieces.

BRIEF DESCRIPTION OF THE DRAWINGS

Embodiments of the invention are described with reference to the accompanying drawings which, for illustrative purposes, are schematic and not drawn to scale.

FIG. 9 is a partial top view of the H bar alignment and registration member of the metrology cassette of FIGS. 8a and 8b showing one side of the H bar member in the configuration of FIG. 8a and showing one side of the H bar member in phantom in the configuration of FIG. 8b.

DETAILED DESCRIPTION

Figure 1:
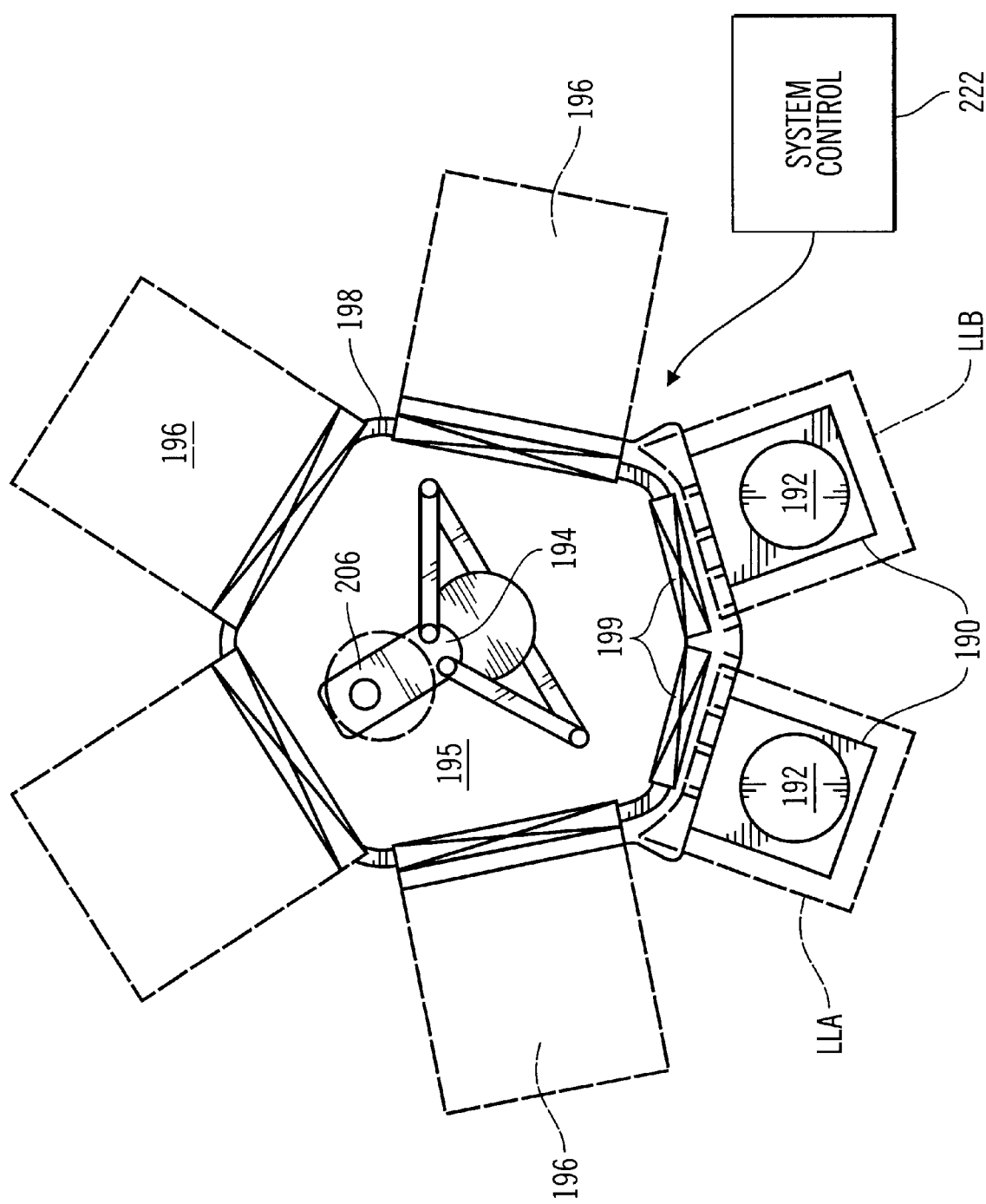
FIG. 1 is a schematic top view of a typical deposition chamber having two loadlock chambers.
Figure 2:
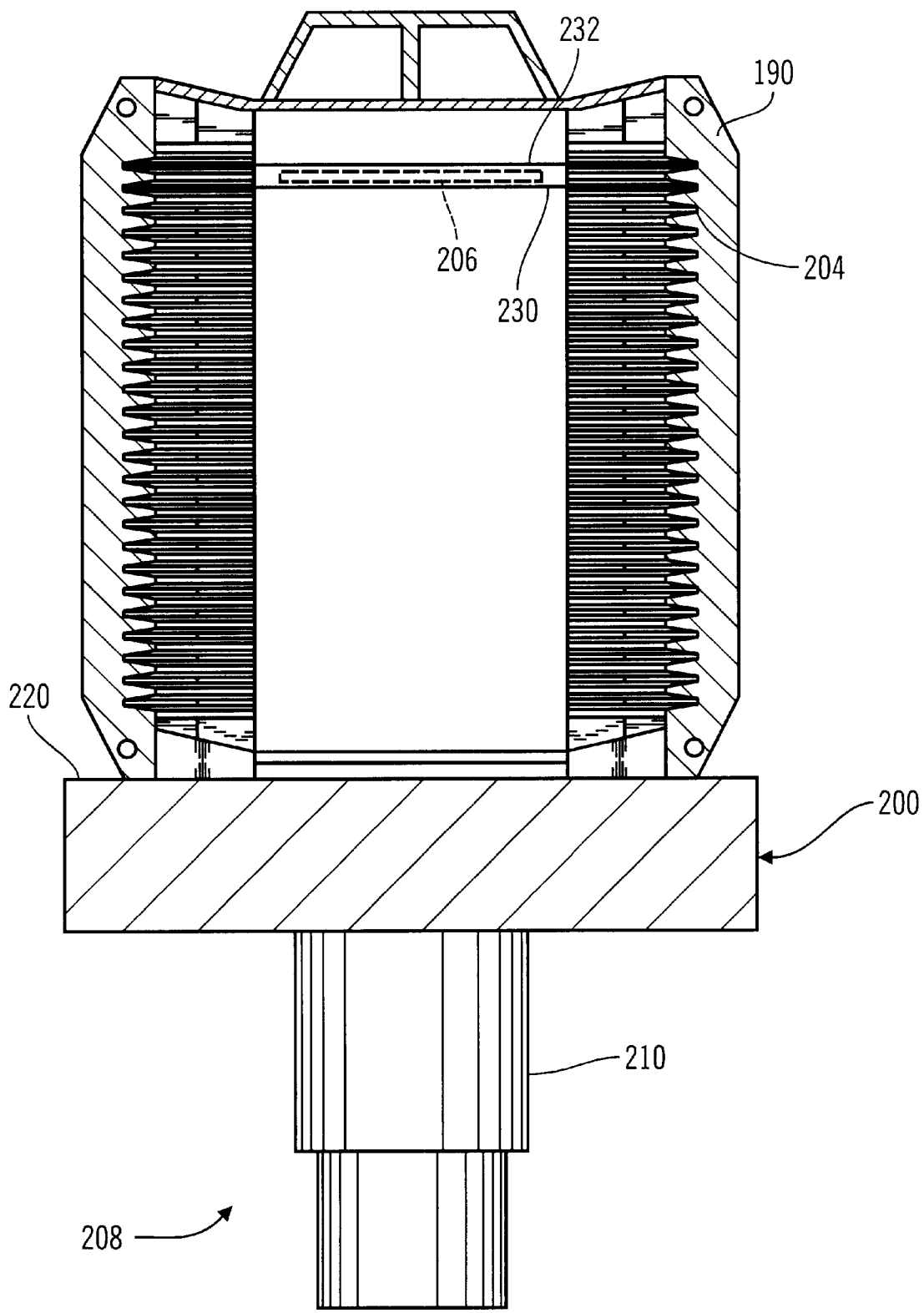
FIG. 2 is a schematic front view of a typical wafer cassette disposed on a platform of a cassette handling system.
Figure 3:
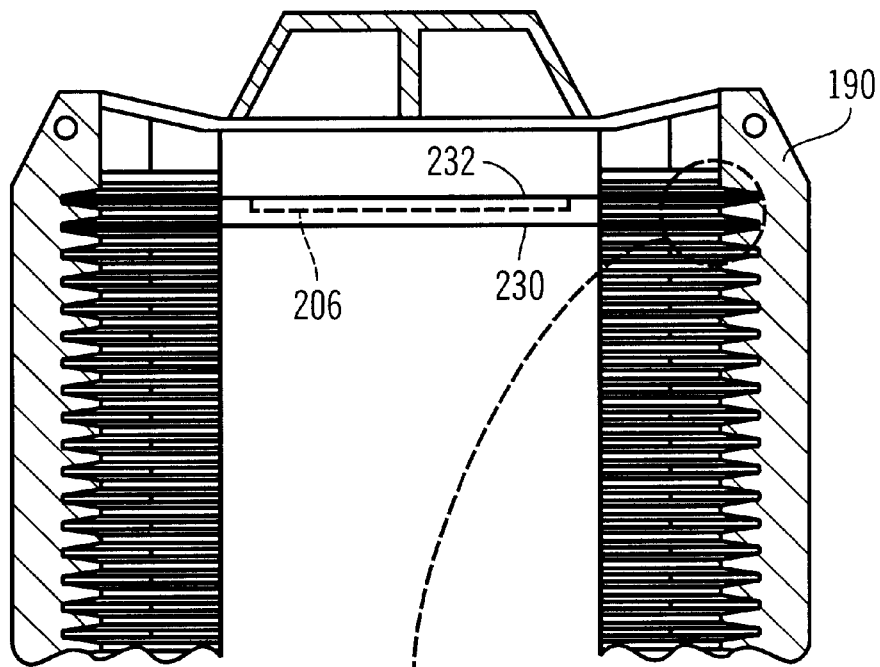
FIG. 3 is a partial view of the wafer cassette of FIG. 2, depicting a wafer resting in a slot and a wafer picked up from a slot.
Figure 3A:
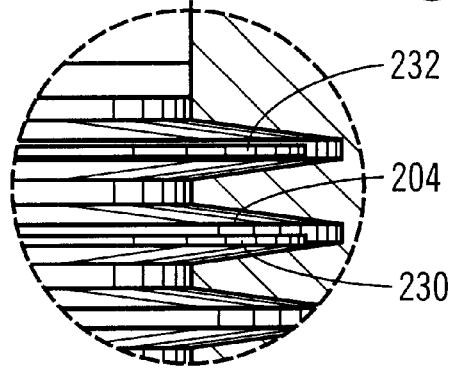
FIG. 3A is an enlarged partial view of the wafer cassette of FIG. 3, depicting a wafer resting in a slot and a wafer picked up from a slot.
Figure 4:
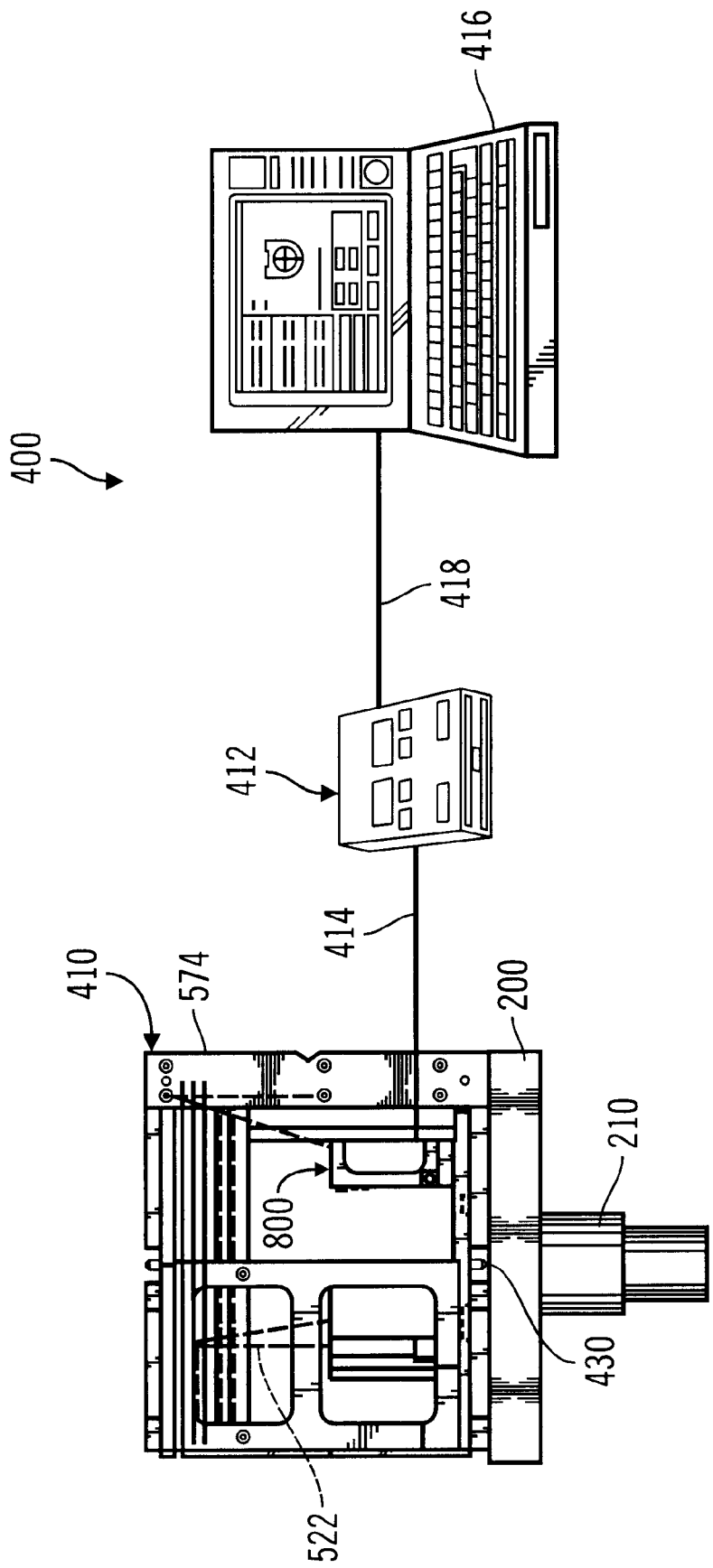
FIG. 4 is a schematic pictorial view of a cassette alignment tool system which includes a prior art metrology cassette.
Figure 5A:
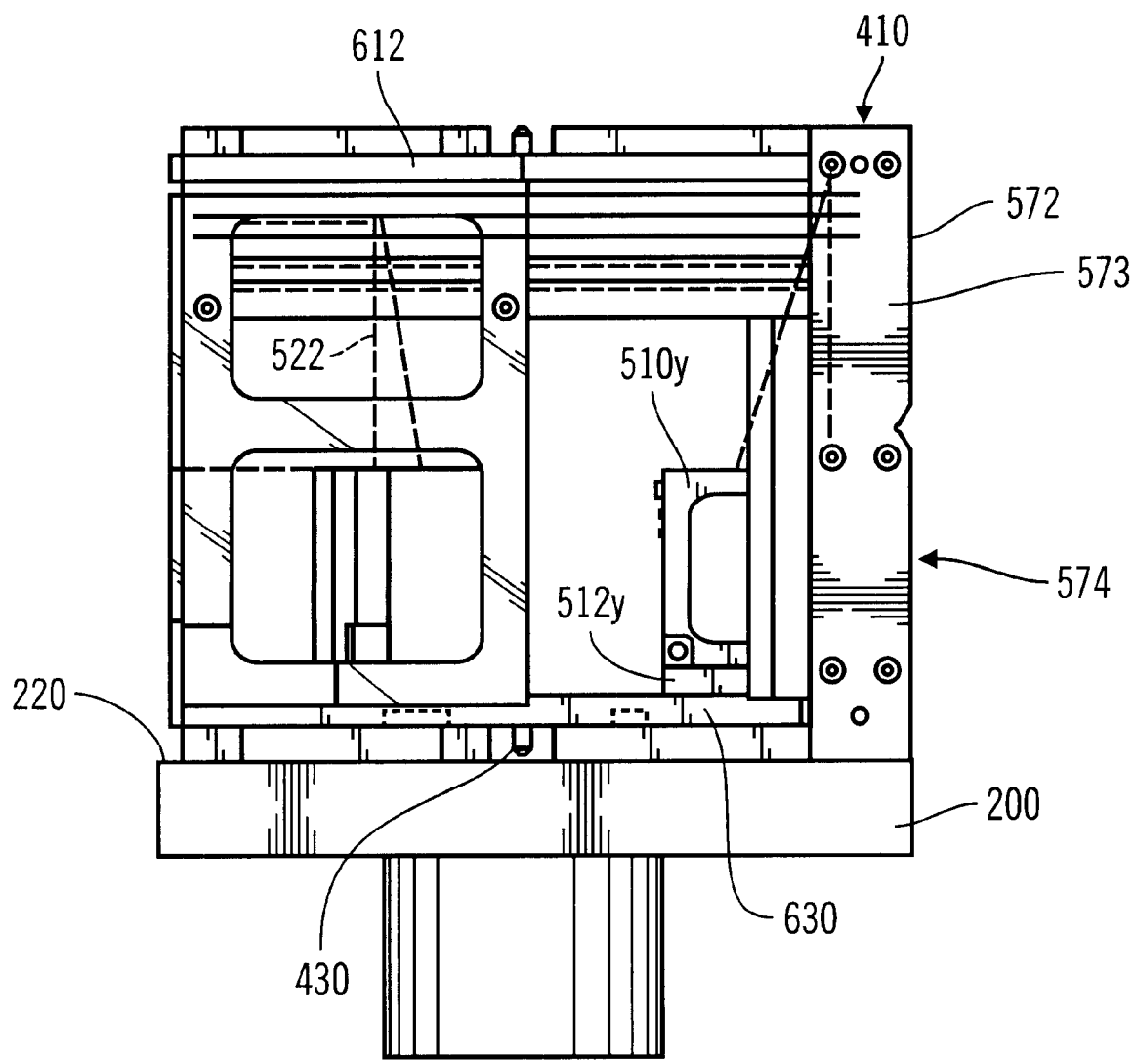
FIG. 5a is a side view of the metrology cassette of FIG. 4.
Figure 5B:
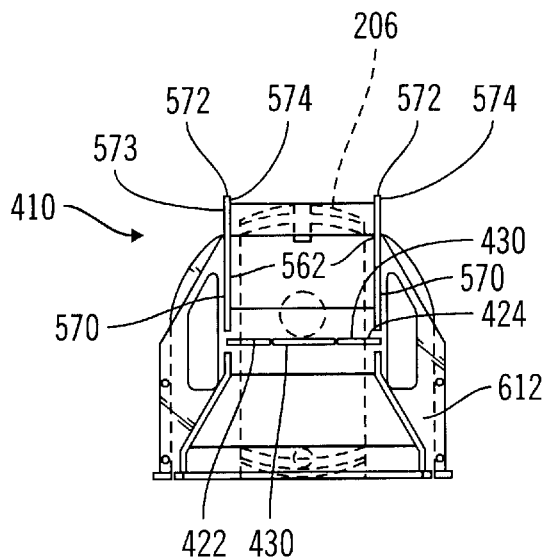
FIG. 5b is a top view of the metrology cassette of FIG. 4.
Figure 5C:
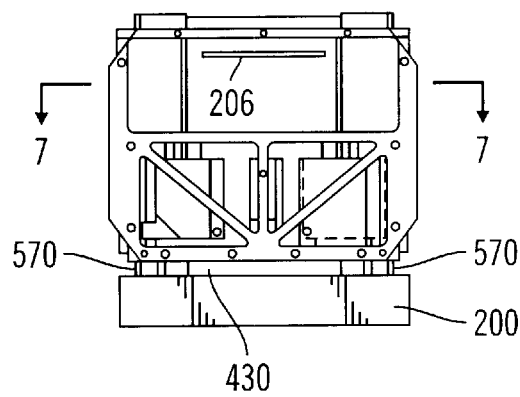
FIG. 5c is a front view of the metrology cassette of FIG. 4.
Figure 5D:
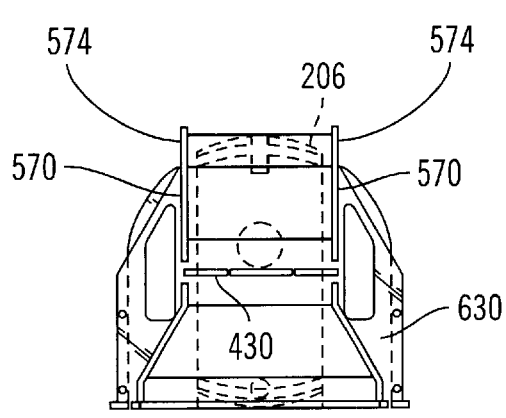
FIG. 5d is a bottom view of the metrology cassette of FIG. 4.
Figure 5E:
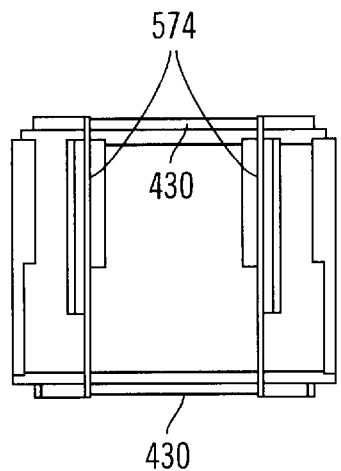
FIG. 5e is a rear view of the metrology cassette of FIG. 4.
Figure 6:
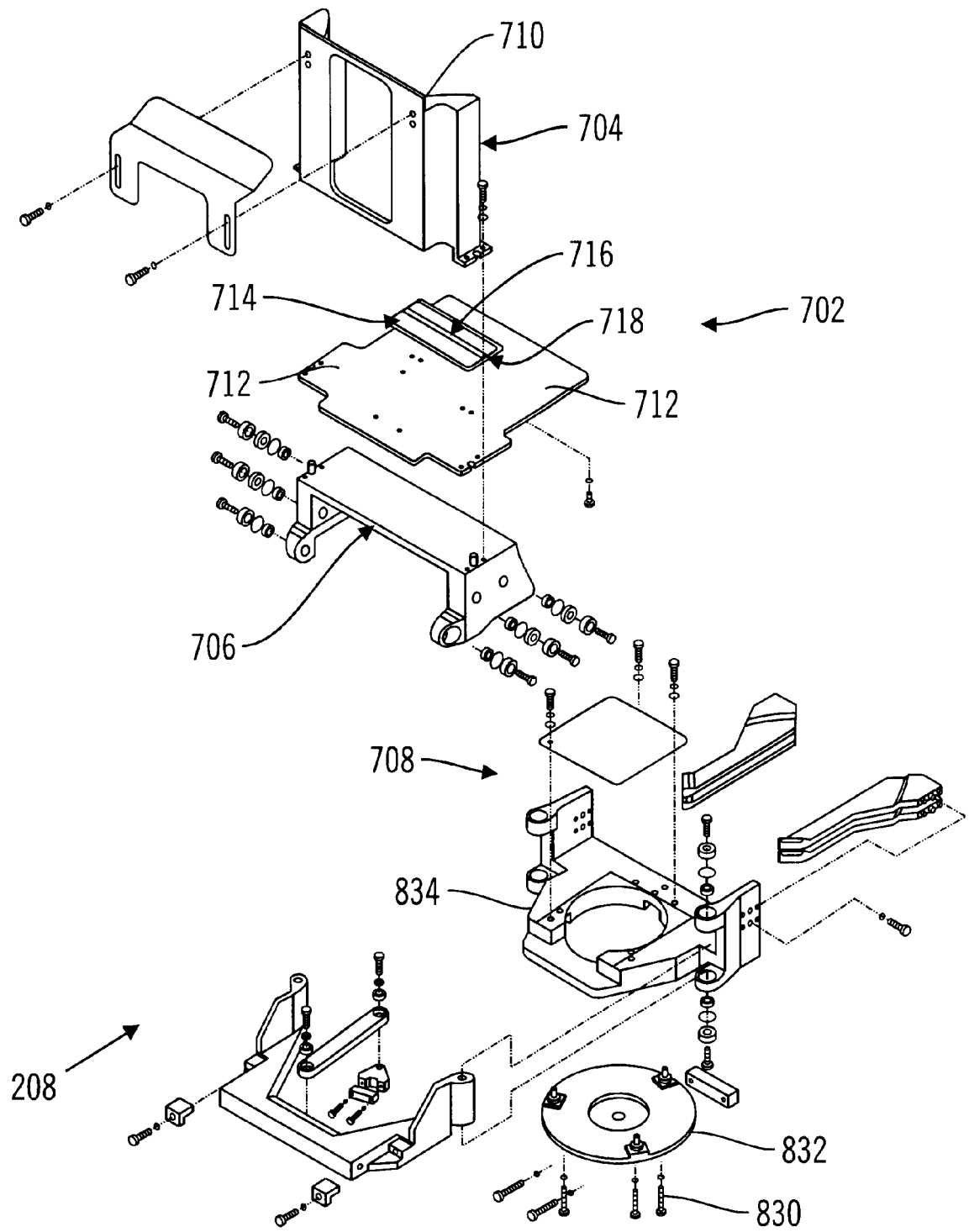
FIG. 6 is an exploded perspective view of a typical cassette handler system.
Figure 7:
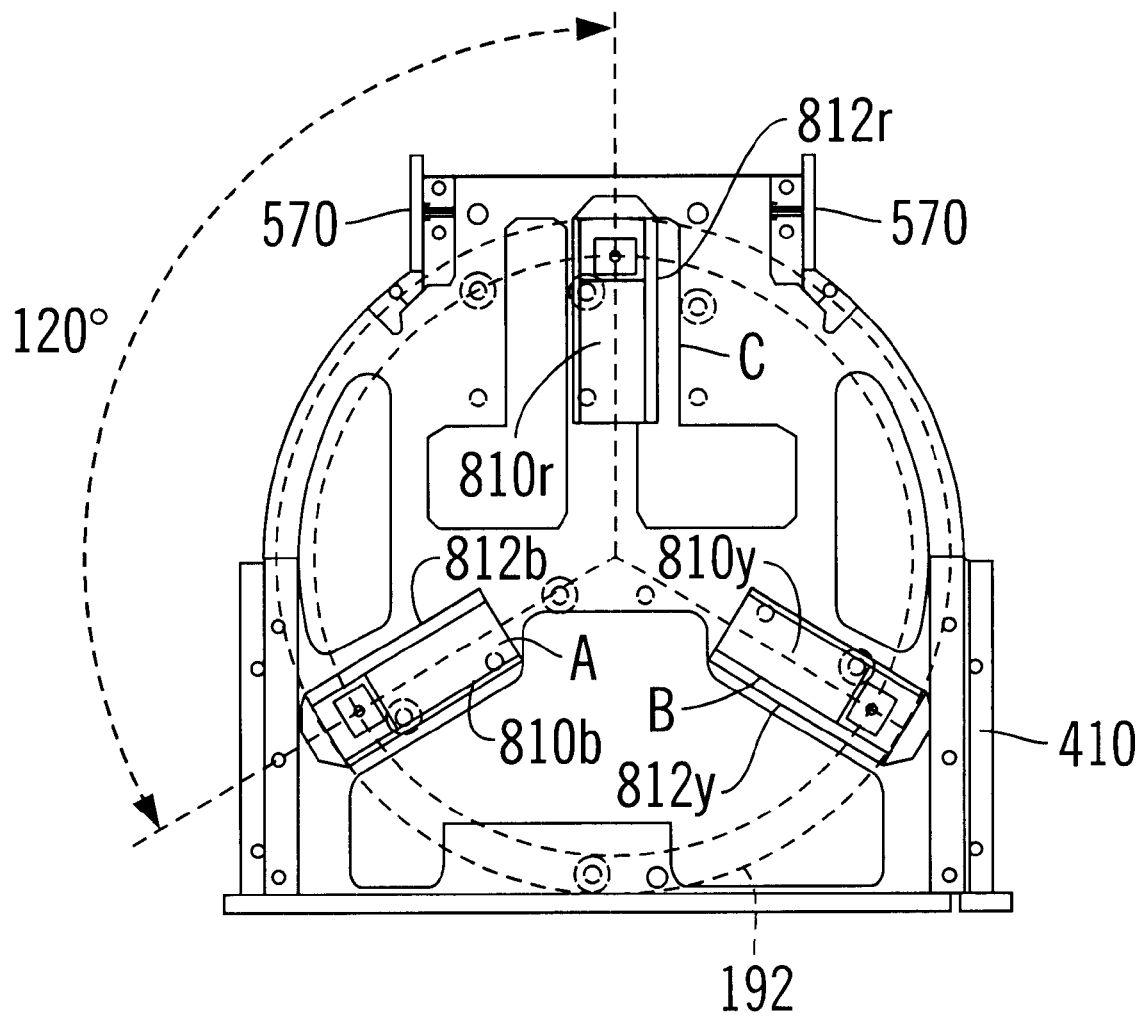
FIG. 7 is a schematic partial cross-sectional top view of the prior art metrology cassette of FIG. 5c as shown along the lines 7—7, showing distance sensors in various configurations.
Figure 8A:
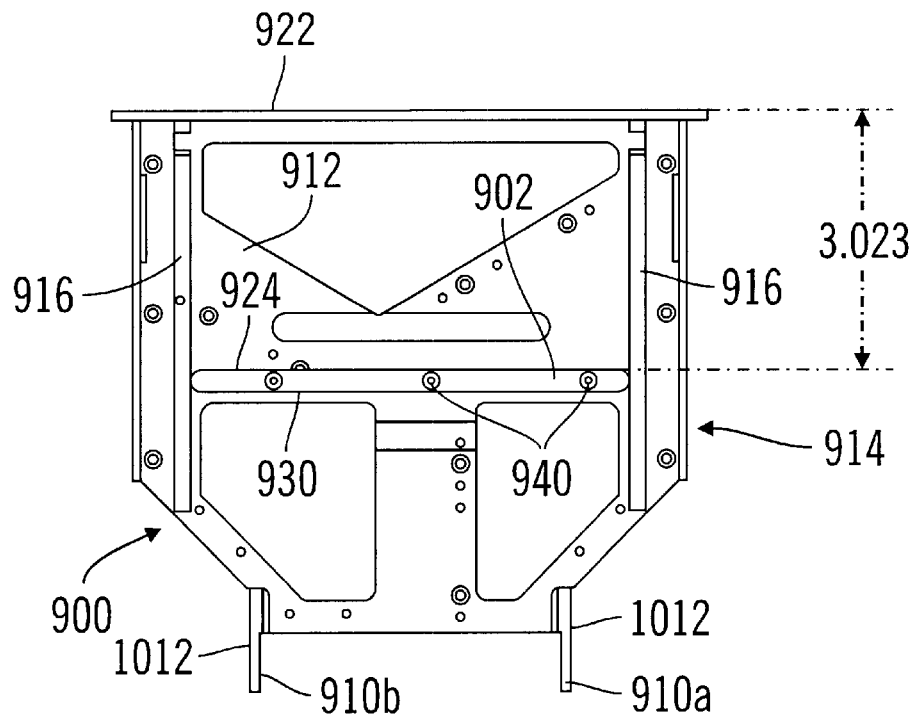
FIG. 8a is a top view of a metrology cassette in accordance with one embodiment of the present inventions, showing the metrology cassette in a first configuration emulating a first type of cassette.
Figure 8B:
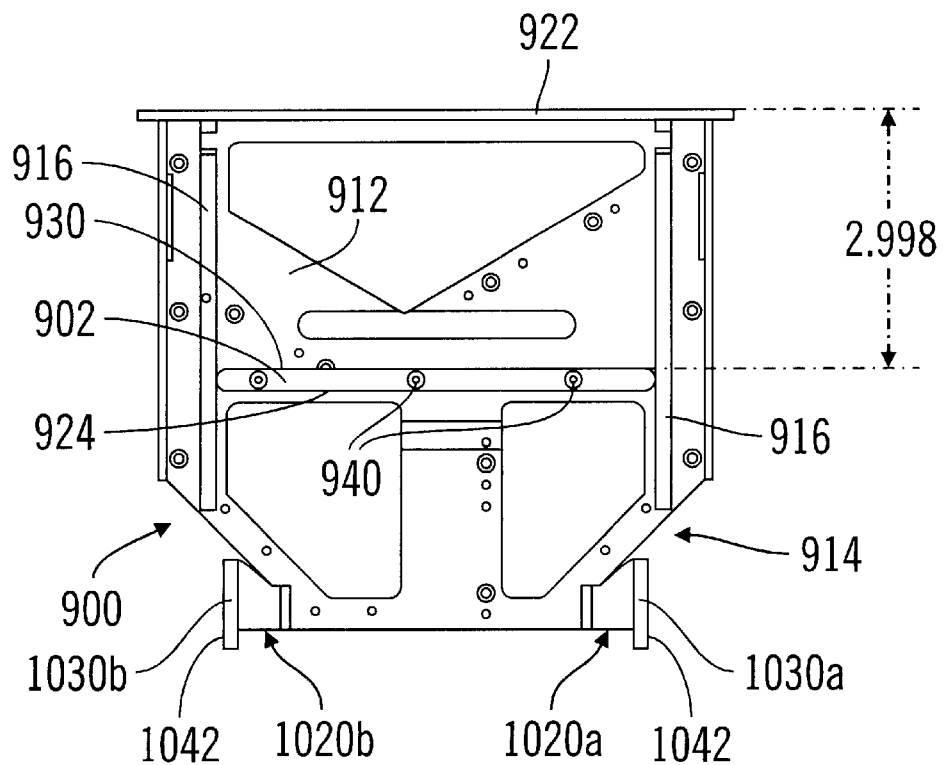
FIG. 8b is a top view of the metrology cassette of FIG. 8a showing the metrology cassette in a second configuration emulating a second type of cassette.

A cassette alignment tool in accordance with one embodiment of the present invention is indicated generally at 900 in FIG. 8a. The cassette alignment tool 900 comprises a metrology cassette suitable for use with a metrology system such as the system of FIG. 4, for example. The metrology system of FIG. 4 includes a cassette controller 412 coupled by communication cables 414 to the metrology cassette 900, and a computer 416 coupled by a communication cable 418 to the cassette controller 412. The metrology cassette 900 of FIG. 8a, like the cassette 410 of FIG. 4, includes distance sensors coupled to the cassette controller 412 by the cables 414 to provide distance measurements of a wafer held within the cassette 900 to align a cassette to the robot blade. In addition, the metrology cassette 900 approximates the size and weight of a production wafer cassette full of wafers, and is secured to the cassette handler platform 200 in a manner similar to that of an actual wafer cassette such as the cassette 190 of FIG. 2 and thus emulates the wafer cassette 190. However, as described in greater detail below, the metrology cassette 900 has removable alignment and registration surfaces including an H-bar 902 and a pair of rear guide rails 910a and 910b which may be shifted in position or replaced to permit the metrology cassette to emulate more than one type of cassette. For example, FIG. 8b illustrates the metrology cassette 900 having been modified in accordance with aspects of the present inventions to emulate a different type of cassette as compared to the cassette being emulated in the embodiment depicted in FIG. 8a The cassette alignment tool system in accordance with the present inventions may be used with processing systems having one or many processing chambers and one or more workpiece handling systems for transferring workpieces from one or more cassettes in one or more loadlock chambers to one or more of the processing chambers. Once a particular handling system has been properly aligned and calibrated to the robot blade and workpiece, the metrology cassette 900 may be removed from the handler and processing of workpieces may begin using a standard workpiece cassette which was emulated by the metrology cassette 900. However, it is preferred that all handlers of a particular processing system be properly aligned prior to initiating processing of production workpieces.

In accordance with one aspect of the illustrated embodiments, the metrology cassette 900 has at least one alignment and registration member which may be shifted in position on the tool 900 so that one metrology tool can emulate more than one type of cassette. In the illustrated embodiment, the metrology cassette tool 900 has an alignment and registration member, that is, an H bar 902, which in the embodiment of FIG. 8a, is fastened to a bottom plate 912 of the frame 914, between a pair of side or support rails 916 of the metrology tool 900, in a position which is parallel to a front face plate 922 of the tool 900 but spaced a first distance from the plate 922. In this position, the H bar 902 emulates the H bar alignment and registration member of an actual cassette in which wafers may be stacked for processing. For example, in the embodiment of FIG. 8a, the leading alignment and registration edge surface 924 of the H bar 902 is spaced a distance of 3.023 in. (7.678 cm) from the tool front plate 922 which coincides with the H bar to front plate spacing of many cassettes which are intended to comply with the SEMI standard for 150 mm cassettes. Thus, in the position illustrated in FIG. 8a, the H bar 902 is positioned to permit the metrology tool 900 to emulate one type of cassette which conforms to the SEMI standard for 150 mm cassettes for purposes of orienting a cassette handler in order to align such a cassette to a robot blade of the processing system.

However, in accordance with one aspect of the present inventions, the H bar 902 may be unfastened and removed from the tool bottom plate 912, reversed in orientation and refastened to the bottom plate 912 as shown in FIG. 8b. In this reversed orientation, the registration and alignment edge surface 930 of the H bar 902, which was the trailing edge in FIG. 8a, is now the leading edge of the H bar in FIG. 8b, that is the edge closest to the tool front plate 922. Furthermore, the spacing between the leading edge (in this case, edge surface 930) and the tool front plate 922 has changed. As a consequence, the H bar 902 can emulate the H bar alignment and registration member of a different actual cassette than the cassette being emulated in the orientation of FIG. 8a. For example, in the orientation of FIG. 8b, the leading edge surface 930 of the H bar 902 is spaced a distance of 2.998 in. (7.615 cm) from the tool front plate 922 which coincides with the H bar to front plate spacing of another commonly used cassette which is also generally complies with the-SEMI standard for H bar alignment and registration surfaces for 150 mm cassettes. Thus, in the position illustrated in FIG. 8b, the H bar 902 is positioned to permit the metrology tool 900 to emulate a different type cassette which conforms to the SEMI standard for 150 mm cassettes for placement of an H bar.

It is anticipated that a shift in the position of an alignment and registration surface of a metrology tool such as the metrology cassette 900 may be achieved in a variety of techniques. For example, in accordance with another aspect of the illustrated embodiments, the H bar 902 is fastened to the tool bottom plate 912 with a plurality of threaded screw fasteners 940, each of which passes through an associated screw hole or aperture 942 formed through the H bar 902. As best seen in FIG. 9, the H bar 902 defines a central plane 950 of symmetry from which the parallel leading and trailing alignment and registration surfaces 924 and 930 are equally spaced. In addition, the surface 942 of each screw hole defines a central axis of symmetry 952. The axis 952 of symmetry of each of the screw holes is in turn aligned in a common plane 955 of symmetry about which each fastener hole 942 is bilaterally symmetric. The common plane 955 of symmetry of the fastener hole surfaces 942 is parallel to but offset from the central plane 950 of the H bar 902 by a distance D1. As a consequence, when the H bar 902 is reversed and refastened to the bottom plate of the tool 900, the leading and trailing edge surfaces of the H bar are offset a distance D2 as shown in FIG. 9 to permit the tool 902 to emulate a different cassette as shown in FIG. 8b.

In the illustrated embodiment, the offset distance D2 is a function of the offset distance D1 such that D2 equals twice the offset distance D1. Thus, if it is desired to shift the H bar a distance of 0.25 in. (0.635 cm), the common plane of symmetry 955 of the fastener surfaces may be offset half that (or 0.125) from the central plane 950 of symmetry of the H bar. It is anticipated that other techniques and fastener means may be used instead of screws and screw holes to selectively fasten the H bar to the metrology tool frame in a plurality of positions so that the tool may emulate different types of cassettes. For example, other types of removable fasteners may be used including clamps or non-threaded elongated members and corresponding apertures such as key members and key slots. Furthermore, it is anticipated that other alignment and registration surfaces of a metrology tool may be shifted in position, such as side or support rails, to emulate other types of cassettes.

Figure 10:
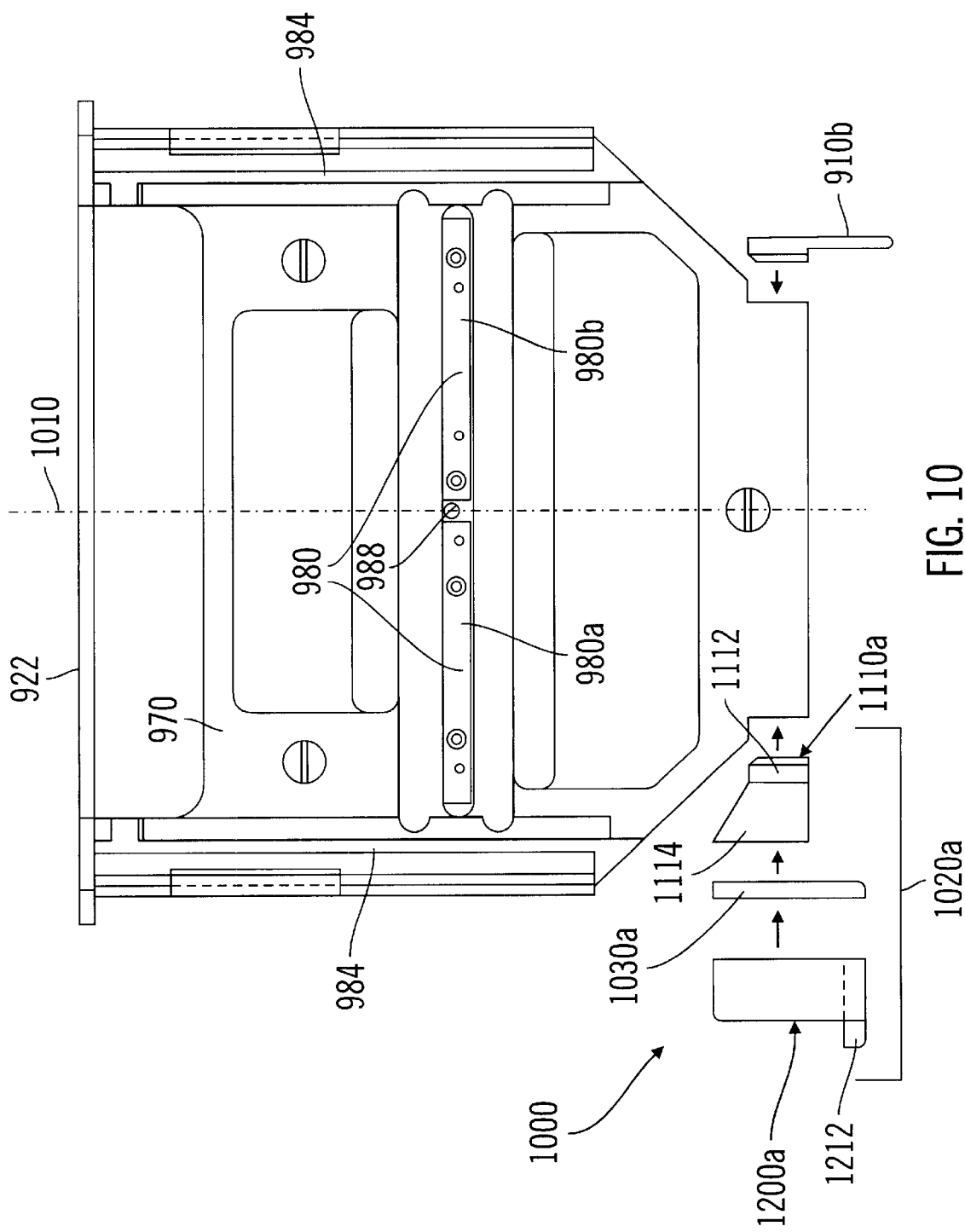
FIG. 10 is a partially exploded view of the top plate of the metrology cassette of FIGS. 8a and 8b, showing elements of a kit for emulating different types of cassettes.

As previously mentioned, for some distance measurements, it may be preferable to flip the metrology tool 900 upside down so that the distance sensors are directed downwardly onto a target workpiece rather than upwardly. Hence, the metrology tool 900 has another set of alignment and registration surfaces disposed on the top plate 970 of the frame 914 of the cassette tool as shown in FIG. 10. These surfaces are provided by members including an H bar 980 and a pair of side rails 984 which are similar to the H bar 902 and side rails 916 disposed on the bottom plate 912 of the frame 914. Thus, the positions of one or more of these alignment and registration surfaces may be shifted in a similar fashion to permit the cassette tool to emulate different types of cassettes in this "upside down" orientation. The H bar 980 may be conveniently implemented using two separate spaced rail-shaped members 986a and 986b as shown in FIG. 10 to accommodate a robot blade alignment hole 988 which is described in greater detail in the aforementioned copending application Ser. No. 09/294,301, filed Apr. 19, 1999.

Figure 12A:
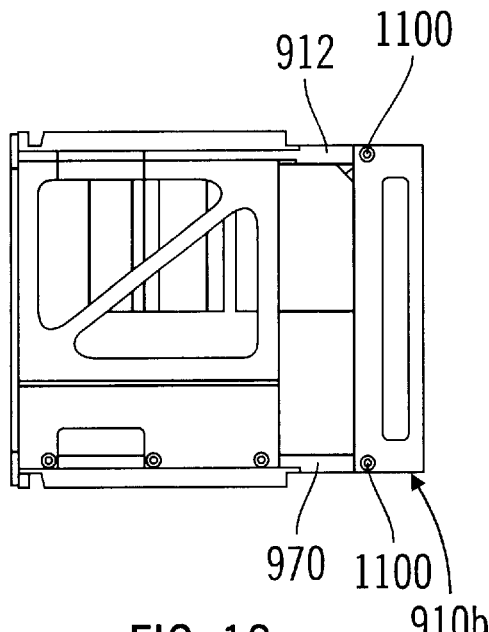
FIGS. 12a and 12b are side and rear views of the cassette configuration of FIG. 8a showing the cassette tool in an inverted position.
Figure 12B:
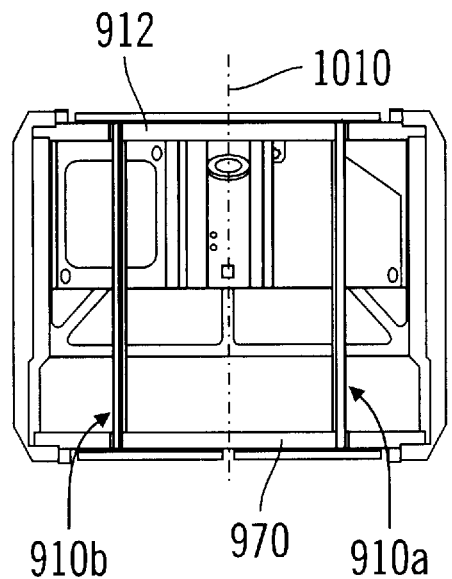

In accordance with another aspect of the illustrated embodiments, another technique may be employed to shift an alignment and registration surface and otherwise adapt a metrology tool to emulate different types of cassettes. FIG. 10 illustrates in an exploded view, a kit 1000 of various components, which facilitates rapid reconfiguration of alignment and registration surfaces such as those of the rear guide rails of the alignment tool 902, to emulate different types of cassettes. In the configuration of FIG. 8a, the left hand rear guide rail 910b (right and left are switched in the upside down configuration of FIG. 10) may be fastened directly to the left rear portion of the frame 914 as shown in FIGS. 8a, 12a and 12b. In a similar manner the right rear guide rail 910a may be fastened directly to the right rear portion of the frame 914 as shown in FIGS. 8a and 12b. In the illustrated embodiment, the rear guide rails 910a and 910b are spaced equally by a desired distance from a central plane 1010 which divides the frame 914 of the metrology cassette 900 in half. In this configuration, the rear guide rails 910a and 910b emulate the rear guide rail alignment and registration members of an actual cassette in which wafers may be stacked for processing. For example, in the embodiment of FIG. 8a, the outer alignment and registration surfaces 1012 of the rear guide rails 910a and 910b are spaced a distance of 3.740 in. (9.5 cm) from each other which coincides with the rear guide rail spacing of many cassettes which are intended to comply with the SEMI standard for 150 mm cassettes. Thus, in the configuration illustrated in FIG. 8a, the rear guide rails 910a and 910b are positioned to permit the metrology tool 900 to emulate a cassette which conforms to the SEMI standard for 150 mm cassettes for purposes of orienting a cassette handler in order to align such a cassette to a robot blade of the processing system.

Figure 12C:
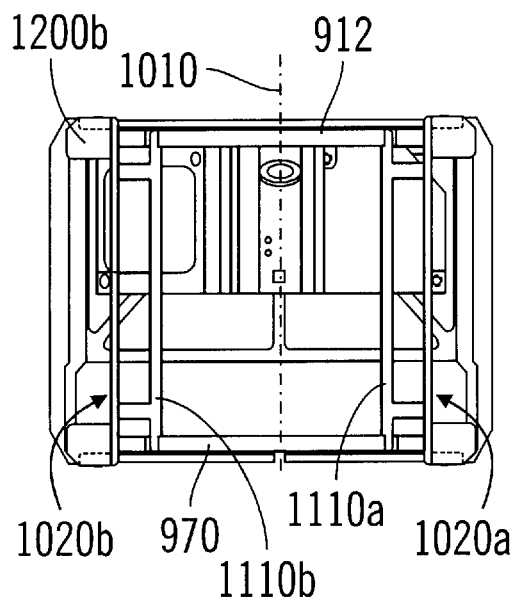
FIGS. 12c and 12d are rear and side views of the cassette configuration of FIG. 8b showing the cassette tool in an inverted position.
Figure 12D:
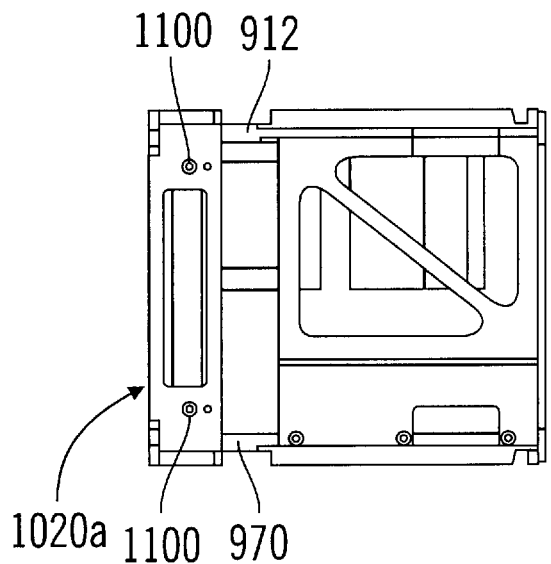

However, in accordance with another aspect of the illustrated embodiments, the guide rails 910a and 910b may be unfastened and removed from the tool frame 914 and a different set of rear guide rails may be attached to permit the metrology tool rear guide rails to emulate the rear guide rails of a different type of cassette. For example, FIGS. 8b, 12c and 12d show an alternative right rear guide assembly 1020a being attached to the right rear portion of the metrology tool frame 914. (FIG. 10 shows an exploded view of the rear guide assembly 1020a.) In a similar fashion, an alternative left rear guide assembly 1020b may be attached to the left rear portion of the metrology tool frame 914 as shown in FIGS. 8b and 12c. Each rear guide assembly 1020a, 1020b includes a rear guide rail member 1030a, 1030b, respectively.

As previously mentioned, for some distance measurements, it may be preferable to flip the metrology tool 900 upside down so that the distance sensors are directed downwardly onto a target workpiece rather than upwardly. Hence, the metrology tool 900 has another set of alignment and registration surfaces disposed on the top plate 970 of the frame 914 of the cassette tool as shown in FIG. 10. These surfaces are provided by members including an H bar 980 and a pair of side rails 984 which are similar to the H bar 902 and side rails 916 disposed on the bottom plate 912 of the frame 914. Thus, the positions of one or more of these alignment and registration surfaces may be shifted in a similar fashion to permit the cassette tool to emulate different types of cassettes in this "upside down" orientation. The H bar 980 may be conveniently implemented using two separate spaced rail-shaped members 980*a* and 980*b* as shown in FIG. 10 to accommodate a robot blade alignment hole 988 which is described in greater detail in the aforementioned copending application Ser. No. 09/294,301, filed Apr. 19, 1999.

Figure 13A:
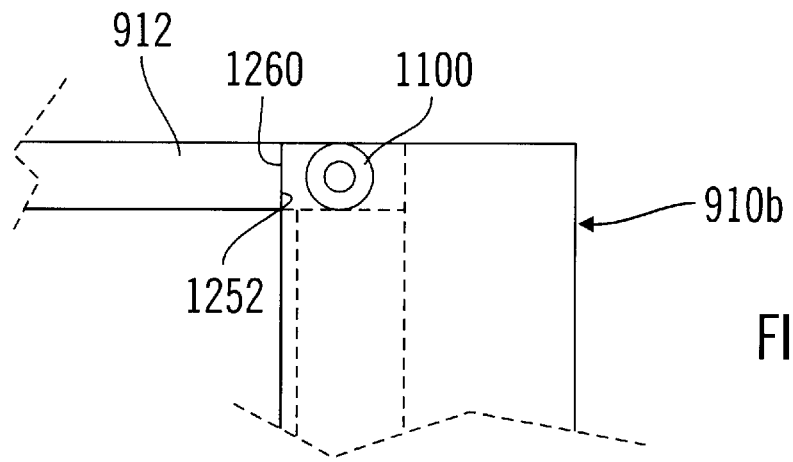
FIG. 13a is a partial side view of the cassette configuration of FIG. 8a showing the cassette tool in an inverted position.

It is anticipated that a shift in the position of an alignment and registration surfaces of guide members such as the rear guide rails of a metrology tool such as the metrology cassette 900 may be achieved in a variety of techniques. For example, in accordance with another aspect of the illustrated embodiments, the rear guide rails 910*a* and 910 are fastened to the frame top plate 970 and the frame bottom plate 912 with a plurality of threaded screw fasteners 1100, each of which passes through an associated screw hole or aperture formed through the guide rails. For example, FIG. 13*a* shows one end of the left rear guide rail 910*b* fastened to the bottom plate 912 of the cassette frame by a screw fastener 1100. In a similar fashion, FIG. 12*a* shows the other end of the left guide rail 910*b* fastened to the frame top plate 970 of the cassette frame by a screw fastener 1100.

Figure 11:
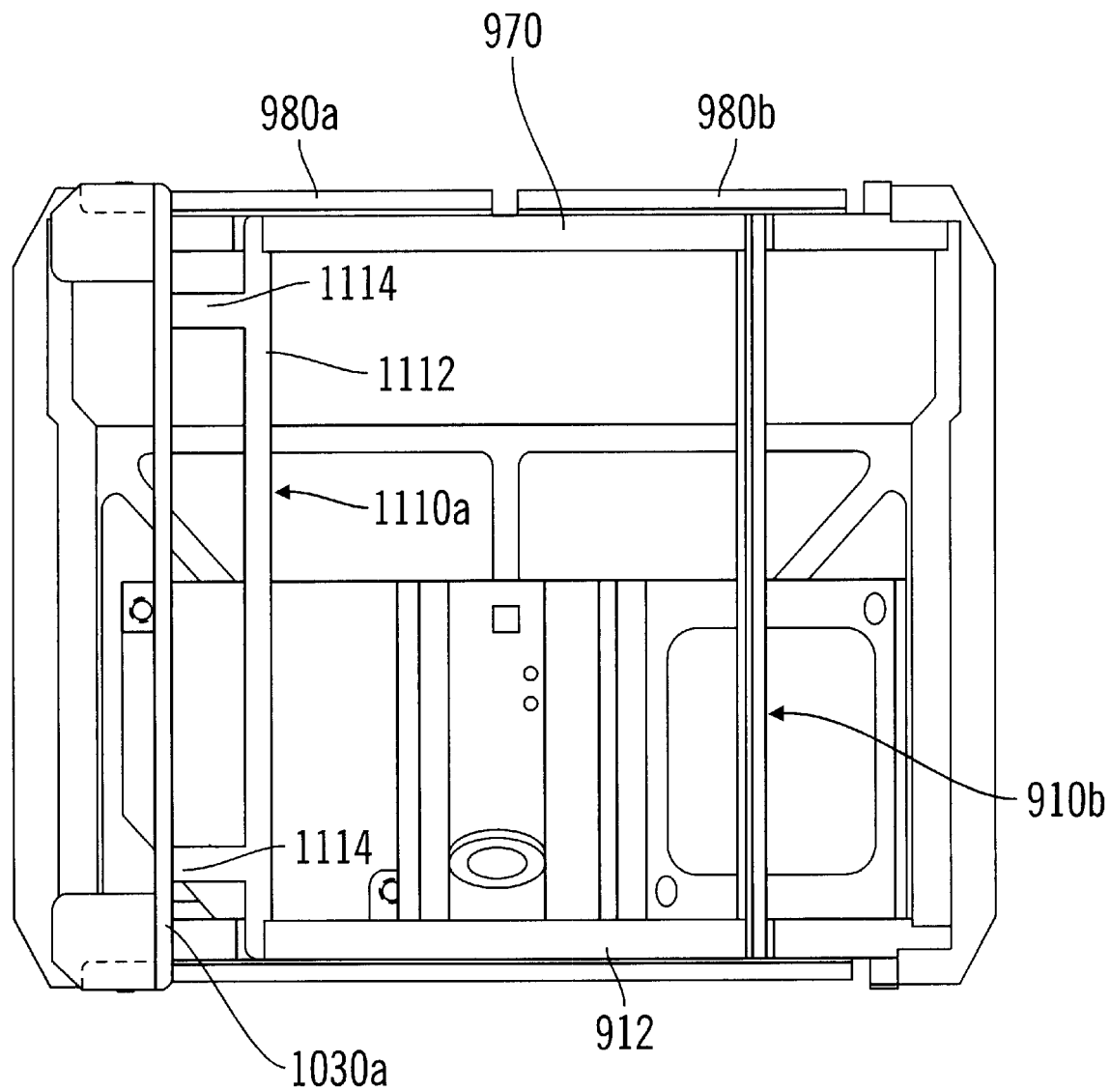
FIG. 11 is a rear view of the cassette of FIG. 10 showing two different types of rear guide rails attached to the rear of the cassette tool.

Accordingly, the each guide rails 910*a* and 910*b* may be readily fastened to (or removed from) the cassette frame by inserting (or removing) two screw fasteners 1100 for each rail. As a consequence, if it is desired to change the type of cassette emulated by the cassette alignment tool 900, the rear guide rails such as rear guide rails 910*a* and 910 may be readily removed and another set of guide rails such as the guide rail assemblies 1020*a* and 1020*b* substituted. In the illustrated examples of the rear guide rail assemblies 1020*a* and 1020*b*, the rear guide rail member 1030*a* or 1030*b* of each assembly is not fastened directly to the top or bottom plates of the frame. Instead, each rear guide rail assembly includes a spacer member 1110*a* or 1110*b* which spaces the rear guide rail member of the assembly from the frame plates. As best seen FIG. 11, each spacer member 1110*a*, 1110*b* includes a bar-shaped portion 1112 from which extend two or more ribs 1114. The rear guide rail member 1030*a*, 1030*b* of each assembly is fastened to the ends of the ribs 1114 by screw fasteners 1120 as shown in FIGS. 11, 12*c* and 12*d*. The upper and lower ends of the spacer members 1110*a* and 1110*b* may be fastened to the top plate 970 and the bottom plate 912 by screw fasteners in a manner similar to that of the rear guide rails 910*a* and 910*b* of the configuration of FIGS. 12*a* and 12*b*. Because of the spacer members, the rear guide rail members of the assemblies 1020*a* and 1020*b* are spaced farther from each other than the rear guide rails 910*a* and 910*b* to permit the cassette alignment tool to emulate a different type of cassette.

In the illustrated embodiments, the rear guide assemblies 1020*a* and 1020*b* further include each a rear guide rail outrigger 1200*a*, 1200*b* which are fastened to the associated rear guide rail member, 1030*a*, 1030*b*. Each rear guide rail outrigger is generally L-shaped and includes a rearward face or flange portion 1212 which is received by an appropriate receptacle of the bucket of the cassette handler for that type of cassette. Each rear guide rail assembly may be fabricated from separate pieces which may then be secured together either permanently by welding, for example, or in a manner which permits disassembly such as by removable fasteners such as threaded screws, for example. Alternatively, the rear guide rail assemblies may be fabricated as one piece or unitary structures. Regardless of the manner of construction, the rear guide rail assemblies may be selectively attached or removed from the cassette frame in order for the tool 900 to emulate the desired cassette. Also each feature described herein as a member may be fabricated from separate pieces which are fastened or otherwise secured together, or alternatively may be fabricated as a one piece or unitary structure.

Figure 13B:
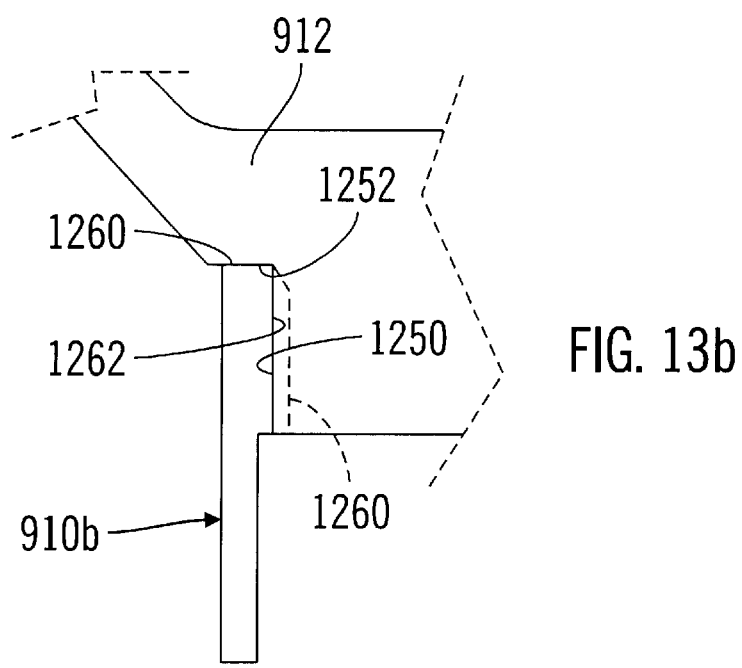
FIG. 13b is a partial top view of the cassette configuration of FIG. 8a showing the cassette tool in an inverted position.
Figure 13C:
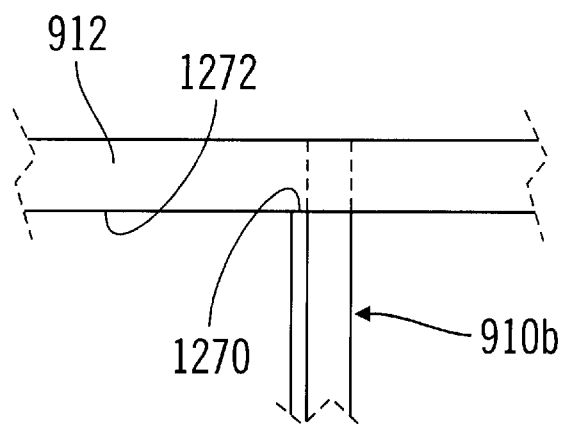
FIG. 13c is a partial cross-sectional view of the cassette configuration of FIG. 8a showing the cassette tool in an inverted position.

In one embodiment, it is preferred that the alignment and registration surfaces of the alignment tool 900 be located with high precision. To facilitate positioning the rear guide assemblies 1020*a*, 1020*b* or the rear guide members 910*a*, 910*b* in the desired position on the cassette frame, the frame 914 has a pair of orthogonal alignment and registration surfaces 1250 and 1252 at the rear of the frame 914 on both the left and right hand sides of each of the top plate 970 and the rear plate as shown for the top plate 970 in FIG. 10 and the bottom plate 912 in FIGS. 13*a*–13*c*. Each pair of surfaces 1250 and 1252 receive a corresponding pair of orthogonal alignment and registrations surfaces 1260 and 1262 of the corresponding rear guide rail or rear guide rail assembly. In addition, each rear guide rail or rear guide rail assembly has a gib surface 1270 at both the top and bottom of the rail. Each gib surface engages an interior surface 1272 of the associated frame plate to further facilitate proper positioning of the rear guide rails. For example, FIGS. 13*a*–13*c* show the frame plate alignment and registration surfaces 1250 and 1252 of the bottom plate 912 engaging the corresponding alignment and registration surfaces 1260 and 1262 at one end of the left rear guide rail 910*b* to key that end of the left rear guide rail 910*b* into place. A gib surface 1270 near the end of the left rear guide rail 910*b* engages the interior surface 1272 of the bottom plate 912. The gib surfaces of each rail further help ensure the desired spacing of the top and bottom frame plates 912 and 970 at the rear of the cassette frames.

In a similar manner, the surfaces 1250 and 1252 on the left and right rear sides of the top and bottom plates 970 and 912 key the spacer bars 1112 of each of the left and right rear guide rail assemblies 1020*a* and 1020*b* into place onto the cassette frame as shown in FIG. 8*b* when the left and right rear guide rail assemblies 1020*a* and 1020*b* are used in place of the left and right rear guide rails 910*a* and 910*b*. Further, gib surfaces 1270 near the top and bottom of the spacer bars 1112 of the rear guide rail assemblies 1020*a* and 1020*b*, engage the associated interior surfaces of the frame plates.

The metrology cassette or fixture 900 of the illustrated embodiment is a precision frame assembly emulating the size and mounting interfaces of a wide range of plastic wafer cassettes. The cassette base plane surfaces and other topmost surface features of the top plate 970 are preferably flat within 0.002" (0.05 mm) for the fixture 900 to fit into the system's cassette handler nest in the cassette inverted position without rocking. These features also may have tight tolerances applied to them so that the assembly will not have excessive lateral movements during its use. The cassette base plane surfaces and other surface features of the base plate 912 may be similarly constructed to facilitate fitting into the system's cassette handler nest in the cassette noninverted position.

In the illustrated embodiment various components of the fixture 410 may be located and assembled with dowel pins to ensure that the basic accuracy of the fixture is not compromised under normal operating conditions. Variations and compromises from the features of individual cassettes can be made so as to accommodate the widest possible range of systems and cassettes. For example, by choosing the smallest size of the registration surfaces within the permitted range of tolerances of the cassettes to be emulated, the number of cassettes which can be emulated by a single tool 900 may be increased.

The metrology cassette 410 of the illustrated embodiment is lightweight, preferably approximating the mass of a production wafer cassette full of wafers. The dimensions, ranges, shapes, materials, sizes, characteristics, finishes, processes and values of the metrology cassette construction are provided as examples and can vary, depending upon the intended application.

It will, of course, be understood that modifications of the illustrated embodiments, in their various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments described herein but should be defined by the appended claims and equivalents thereof.

What is claimed is:

1. A metrology tool for aligning a cassette handler to a workpiece processing tool, wherein the cassette handler has a plurality of registration surfaces, each registration surface adapted to engage an alignment member of a cassette of workpieces, comprising:
    a fastener; and
    a frame having a removable alignment member adapted to emulate a cassette alignment member, said removable alignment member having a fastener surface adapted to be engaged by said fastener;
    wherein said fastener and said alignment member fastener surface are adapted to selectively fasten said removable alignment member to said frame in one of a first position and a second position which is offset with respect to said first position, wherein said frame emulates a first cassette when said removable alignment member is fastened to said frame in said first position and said frame emulates a second cassette when said removable alignment member is fastened to said frame in said second position.

2. The metrology tool of claim 1 wherein said removable alignment member defines a central plane of symmetry, and said alignment member fastener surface defines a plane of symmetry, wherein said alignment member fastener surface plane of symmetry is offset with respect to said alignment member central plane of symmetry.

3. The metrology tool of claim 2 wherein said fastener includes an elongated member and said alignment member fastener surface defines an aperture adapted to receive said fastener member.

4. The metrology tool of claim 3 wherein said fastener is a screw fastener and said alignment member fastener aperture defines a screw hole which defines a central axis of symmetry which is contained within said alignment member fastener surface plane of symmetry.

5. The metrology tool of claim 4 wherein said tool includes a plurality of said screw fasteners and said alignment member includes a plurality of said screw holes, each screw hole being aligned with said alignment member fastener surface plane of symmetry.

6. The metrology tool of claim 1 wherein said alignment member is an "H" bar.

7. The metrology tool of claim 1 wherein said cassette handler includes a platform having an H bar alignment nest which defines a slot and said alignment member is an "H" bar adapted to be received by slot of said alignment nest.

8. The metrology tool of claim 1 wherein said alignment member is a bar having a first longitudinal edge and a second longitudinal edge parallel to said first edge.

9. The metrology tool of claim 8 wherein said frame defines a front face parallel to said alignment member, and said alignment member first edge is positioned closer to said front face than is said second edge when said removable alignment member is fastened to said frame in said first position, and said alignment member second edge is positioned closer to said front face than is said first edge when said removable alignment member is fastened to said frame in said second position.

10. The metrology tool of claim 9 wherein said alignment member first edge is spaced from said frame front face a first distance when said removable alignment member is fastened to said frame in said first position and said alignment member second edge is spaced from said front face a second distance different from said first distance when said removable alignment member is fastened to said frame in said second position.

11. A metrology tool for aligning a cassette handler to a workpiece processing tool, wherein the cassette handler has a plurality of registration surfaces, each registration surface adapted to engage an alignment member of a cassette of workpieces, comprising:
    a frame adapted to emulate a cassette, said frame having a removable alignment member adapted to engage said cassette handler registration surface; and
    fastener means for selectively fastening said alignment member to said frame in one of a first position and a second position offset with respect to said first position, wherein said frame emulates a first type of cassette when said alignment member is fastened to said frame in said first position and said frame emulates a second type of cassette when said alignment member is fastened to said frame in said second position.

12. A method of aligning a cassette handler to a workpiece processing tool, comprising:
    unfastening a removable alignment member from a first position on a frame which is adapted to emulate a cassette;
    fastening said alignment member in a second position on said frame wherein said second position is offset with respect to said first position; and
    placing said frame on said cassette handler so that said alignment member in said second position on said frame engages a registration surface on said handler.

13. A metrology tool for aligning a cassette handler to a workpiece processing tool, wherein the cassette handler has an H bar alignment nest having a slot adapted to receive an H bar of a cassette of workpieces, comprising:
    a plurality of screw fasteners; and
    a frame having a front face and a removable H bar member parallel to said face, said H bar member having a first longitudinal edge and a second longitudinal edge parallel to said first edge, said H bar member being adapted to emulate a cassette H bar member and defining a plurality of screw holes adapted to be engaged by said screw fasteners, wherein said H bar member defines a central plane of symmetry, and said screw holes define a plane of symmetry, wherein said screw holes plane of symmetry is offset with respect to said H bar member central plane of symmetry; and wherein said screw fasteners and screw holes are adapted to selectively fasten said removable H bar member to said frame in one of a first position and a second position which is offset and reversed with respect to said first position, wherein said frame emulates a first cassette when said removable H bar member is fastened to said frame in said first position and said frame emulates a second cassette when said removable H bar member is fastened to said frame in said second position; and wherein said H bar member first edge is positioned closer to said front face than is said second edge when said removable H bar member is fastened to said frame in said first position and said H bar member second edge is positioned closer to said front face than is said first edge when said removable H bar member is fastened to said frame in said second position, and wherein said alignment member first edge is spaced from said frame front face a first distance when said removable alignment member is fastened to said frame in said first position and said alignment member second edge is spaced from said front face a second distance different from said first distance when said removable alignment member is fastened to said frame in said second position.

14. A metrology tool kit for aligning a cassette handler to a workpiece processing tool, wherein the cassette handler has a plurality of registration surfaces, each registration surface being adapted to engage an alignment member of a cassette of workpieces, comprising:

a frame which defines a central plane;

a first removable alignment member adapted to emulate a first cassette alignment member, said first removable alignment member being adapted to be selectively attached to said frame so that said first removable alignment member is spaced from said frame central plane a first distance;

a second removable alignment member adapted to emulate a second cassette alignment member, said second removable alignment member being adapted to be selectively attached to said frame instead of said first removable alignment member so that said second removable alignment member is spaced from said frame central plane a second distance greater than said first distance;

wherein said frame and said first removable alignment member emulate a first cassette when said first removable alignment member is attached to said frame and said frame and said second removable alignment member emulate a second cassette when said second removable alignment member is attached to said frame instead of said first removable alignment member.

15. The metrology tool kit of claim 14 wherein said second removable alignment member includes a rail-shaped member adapted to engage a cassette handler registration surface, said second removable alignment member further including a spacer member adapted to space said rail-shaped member from said central plane of said frame, said spacer member further being adapted to be selectively attached to and removed from said frame.

16. The metrology tool kit of claim 15 wherein said second removable alignment member includes a rear face member coupled to said rail-shaped member and adapted to engage a cassette handler registration surface.

17. The metrology tool kit of claim 15 wherein said first removable alignment member is a rear guide rail.

18. The metrology tool kit of claim 17, wherein said second removable alignment member includes a rail-shaped member.

19. The metrology tool kit of claim 14 wherein said first removable alignment member is a rear guide rail.

20. The metrology tool kit of claim 19 wherein said second removable alignment member includes a rear guide rail.

21. The metrology tool kit of claim 20 wherein said second removable alignment member further includes a rear guide rail outrigger.

22. The metrology tool kit of claim 20 wherein said cassette handler includes a bucket having a receptacle and said rear guide rail is adapted to be received by said receptacle of said cassette handler bucket.

23. The metrology tool kit of claim 14 wherein said cassette handler includes a bucket having a receptacle and said first removable alignment member is a rear guide rail adapted to be received by said receptacle of said cassette handler bucket.

24. A metrology tool kit for aligning a cassette handler to a workpiece processing tool, wherein the cassette handler has a registration surface adapted to engage an alignment member of a cassette of workpieces, comprising:

a frame which defines a central plane;

a first removable alignment member adapted to emulate a first cassette alignment member;

a second removable alignment member adapted to emulate a second cassette alignment member; and attachment means for selectively attaching said first removable alignment member to said frame so that said first removable alignment member is spaced from said frame central plane a first distance; and for selectively attaching said second removable alignment member to said frame instead of said first removable alignment member so that said second removable alignment member is spaced from said frame central plane a second distance greater than said first distance;

wherein said frame and said first removable alignment member emulate a first cassette when said first removable alignment member is attached to said frame and said frame and said second removable alignment member emulate a second cassette when said second removable alignment member is attached to said frame instead of said first removable alignment member.

25. A method of aligning a cassette handler to a workpiece processing tool, comprising:

unfastening a first removable alignment member from a frame which is adapted to emulate a first cassette when said first removable alignment member is fastened to said frame; and fastening a second removable alignment member to said frame in place of said first removable alignment member so that said frame and said second removable alignment member emulate a second cassette different from said first cassette when said second removable alignment member is attached to said frame instead of said first removable alignment member; and placing said frame on said cassette handler so that said second removable alignment member on said frame engages a registration surface on said handler.

26. A metrology tool kit for aligning a cassette handler to a workpiece processing tool, wherein the cassette handler has a bucket which has a plurality of registration surfaces, each registration surface being adapted to engage a rear guide rail member of a cassette of workpieces, comprising:

a frame which defines a central plane;

a first pair of removable rear guide rail members adapted to emulate a first pair of rear guide rail members of a first cassette;

a plurality of screw fasteners adapted to removably attach said first pair of removable rear guide rail members to said frame so that each removable rear guide rail member is spaced from said frame central plane a first distance;

a second pair of removable rear guide rail assemblies adapted to emulate a second pair of rear guide rail members of a second cassette, each removable rear guide rail assembly of said second pair of removable rear guide rail assemblies including an outrigger member, a rail-shaped member and a spacer member adapted to space said rail-shaped member from said central plane of said frame a second distance greater than said first distance, said spacer member further being adapted to be selectively attached to and removed from said frame by said plurality of screw fasteners wherein said second pair of removable rear guide rail assemblies are selectively attached to said frame instead of said first pair of removable rear guide rail members so that each removable rail-shaped member of said second pair of assemblies is spaced from said frame central plane a second distance greater than said first distance;

wherein said frame and said first pair of removable rear guide rail members emulate a first cassette when said first pair of removable rear guide rail members are attached to said frame, and said frame and said second pair of removable rear guide rail assemblies emulate a second cassette when said second pair of removable rear guide rail assemblies are attached to said frame instead of said first pair of removable rear guide rail members.

* * * * *